United States Patent
Rusu et al.

(10) Patent No.: US 8,732,647 B1
(45) Date of Patent: May 20, 2014

(54) METHOD FOR CREATING PHYSICAL CONNECTIONS IN 3D INTEGRATED CIRCUITS

(71) Applicant: Atrenta, Inc., San Jose, CA (US)

(72) Inventors: Lenuta Georgeta Claudia Rusu, Fontaine (FR); Kaushal Kishore Pathak, Ghaziabad (IN); Ravi Varadarajan, Fremont, CA (US)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 14/012,734

(22) Filed: Aug. 28, 2013

Related U.S. Application Data

(60) Provisional application No. 61/780,526, filed on Mar. 13, 2013.

(51) Int. Cl.
*G06F 17/50* (2006.01)

(52) U.S. Cl.
USPC ........... 716/126; 716/123; 716/129; 716/130; 716/131

(58) Field of Classification Search
USPC .................................. 716/123, 126, 129–131
See application file for complete search history.

(56) References Cited

U.S. PATENT DOCUMENTS

| | | | |
|---|---|---|---|
| 7,435,619 B2 | 10/2008 | Shim et al. | |
| 7,701,252 B1 * | 4/2010 | Chow et al. | 326/41 |
| 7,707,536 B2 * | 4/2010 | Lin et al. | 716/126 |
| 7,723,207 B2 | 5/2010 | Alam et al. | |
| 7,772,880 B2 * | 8/2010 | Solomon | 326/38 |
| 8,006,216 B1 * | 8/2011 | Chen et al. | 716/126 |
| 8,084,854 B2 | 12/2011 | Pratt et al. | |
| 8,089,299 B1 * | 1/2012 | Rahman et al. | 326/38 |
| 8,136,071 B2 | 3/2012 | Solomon | |
| 8,158,515 B2 | 4/2012 | Farooq et al. | |
| 8,239,809 B2 | 8/2012 | Fujita | |
| 8,258,810 B2 * | 9/2012 | Or-Bach et al. | 326/39 |
| 8,293,578 B2 * | 10/2012 | Bartley et al. | 438/109 |
| 8,330,489 B2 * | 12/2012 | Bartley et al. | 326/41 |
| 8,359,554 B2 | 1/2013 | Wang et al. | |
| 8,373,439 B2 * | 2/2013 | Or-Bach | 326/38 |
| 8,386,690 B2 * | 2/2013 | Li et al. | 710/316 |
| 8,402,404 B1 * | 3/2013 | Mehta et al. | 716/106 |
| 8,516,409 B2 * | 8/2013 | Coteus et al. | 716/101 |
| 2006/0234405 A1 * | 10/2006 | Best | 438/15 |
| 2010/0271071 A1 * | 10/2010 | Bartley et al. | 326/101 |
| 2011/0093827 A1 * | 4/2011 | Tsurusaki et al. | 716/113 |
| 2012/0198406 A1 * | 8/2012 | Bartley et al. | 716/122 |
| 2012/0266125 A1 | 10/2012 | Carpenter et al. | |
| 2013/0298101 A1 * | 11/2013 | Chandra | 716/136 |

* cited by examiner

*Primary Examiner* — Naum Levin
(74) *Attorney, Agent, or Firm* — Thomas Schneck; Mark Protsik

(57) ABSTRACT

An electronic design automation method implemented in a computing system is provided for creating a physical connections netlist for a pre-floorplan partitioned design file of 3D integrated circuits. The inputs are a 3D stack defining the topology of multiple dies, and a given design partitioning. The design partitioning defines the logic implemented in each die. The method identifies through-silicon-vias (TSVs), bump pins (BPs) and net connections.

16 Claims, 3 Drawing Sheets

METHOD FOR CREATING PHYSICAL CONNECTIONS IN 3D INTEGRATED CIRCUITS

CROSS-REFERENCE TO RELATED APPLICATION

The present application claims priority under 35 U.S.C. 119(e) from prior U.S. provisional application No. 61/780,526, filed on Mar. 13, 2013.

TECHNICAL FIELD 3D integration is a promising technology for dealing with current integrated circuit (IC) issues such as large area and great numbers of long wires. 3D integration refers to stacking tiers of dies one atop another, in the same IC. Dies in adjacent tiers of the 3D stack are connected vertically. Consequently, the IC area is diminished and the form factor is improved. Likewise, the length of wires is reduced, since design blocks are closer to each other. This enables higher interconnect densities. Furthermore, 3D integration brings in the great possibility of heterogeneous integration. Thus, each die can be realized in a different technology node. Besides, logic dies can be integrated together with dies containing: memories, MEMS, RF blocks, chemical and bio sensors, etc.

BACKGROUND ART

To enable 3D IC realization, EDA tools have to support 3D capabilities, especially when dealing with physical aspects of the design flow. In 2D designs, a physical net corresponds to each logical net. However, this 1-to-1 correspondence cannot be realized in 3D ICs. During the design partitioning phase, different logic modules (IPs) can be assigned to different tiers of the 3D stack, by considering optimization criteria, such as connection density, die utilization technology node for a given die etc. In such cases, a single physical net is not enough to connect the two IPs. The connection has to pass through multiple dies and connect through instantiations of through-silicon-via (TSV) and bump pins (BP). Therefore, a more complex physical connection is needed to implement logical connections in 3D ICs. Moreover, each die will typically be represented by a partitioned netlist before detailed implementation. It is very important to maintain the relationship between the original logical net in a 3D designs and the various components of the net in the individual dies.

SUMMARY DISCLOSURE

An electronic design automation method and a computing system implementing the method are provided for creating a physical connection netlist for a pre-floorplan partitioned design file of a 3D integrated circuit containing stacked tiers of dies. The system comprises at least one processing unit and a memory accessible by the processing unit, the memory storing a set of program instructions of a 3D physical connection tool that when executed by the processing unit causes the system to perform the steps of the method.

The method begins by receiving into the system and storing in the memory a hardware description of a pre-floorplan integrated circuit, the design having been partitioned so as to assign logic to respective ones of multiple dies, the design further including a 3D stack model defining locations and orientations of the multiple dies within a stack of tiers of such dies, each tier containing one or more dies at a same level in the stack. Next, the system selects and processes in successive iterations different pairs of dies from the stored hardware description of the partitioned circuit design. For each selected pair of dies the processing comprises successive iterations of creating physical connections data for selected die paths connecting the pair of dies. The physical connections data define through-silicon vias (TSVs), bump pins and both intra-die and inter-die connecting nets for the selected die paths of the pair of dies. All created physical connections data for all selected pairs of dies is stored in the memory as a netlist for the received design.

The 3D stack model may be represented as data defining a die graph with dies of the partitioned circuit design as nodes of the graph and connections between dies as edges of the graph, and the selection of die paths to connect pairs of dies may be performed using this die graph of the 3D stack. Further, the die paths to connect pairs of dies may be selected so as to minimize the number of visited dies. Also, in the creation of physical connections data, any multiple fan-ins and fan-outs of inter-die connections may be processed through a common die path.

Intra-die connecting nets can define any one or more metal layer connections: (a) between die circuit modules in the design, (b) between one or more die circuit modules and bump pins on a face of a die, (c) between one or more die circuit modules and TSVs of a die, (d) between two or more bump pins of a die, and (e) between one or more bump pins and TSVs of a die. Inter-die connecting nets can define any one or more of bump pin connections between overlapping die in adjacent tiers.

DETAILED DESCRIPTION

Figure 1:
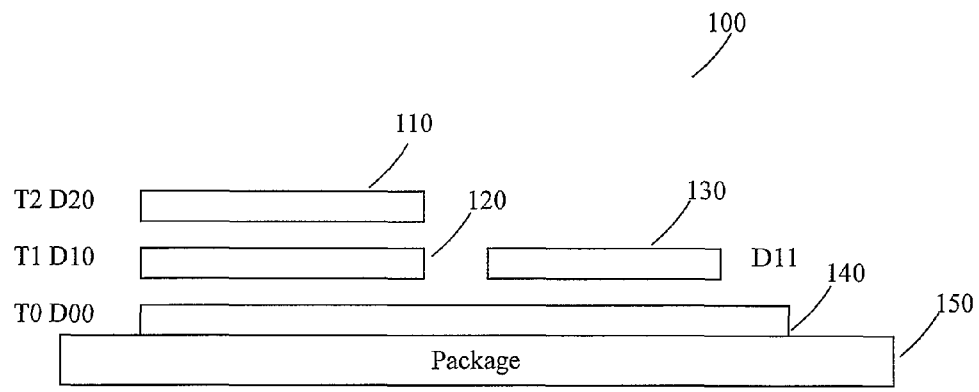
FIG. 1 shows a 3D IC with multiple dies arranged in tiers.

A 3D stack, 100, is composed of tiers, vertically stacked, as represented in FIG. 1. Each tier contains one or more dies. Tiers are entities used to group dies at the same level in the stack. In the example in FIG. 1, there are 3 tiers, T0, T1 and T2. The bottom tier, T0, has 1 die, D0, labeled 140. The middle tier, T1, has 2 dies, D10 and D11, labeled 120 and 130. The upper tier, T2, has 1 die, D20, labeled 110. The bottom die, 140, is connected to the package, 150.

Figure 2:
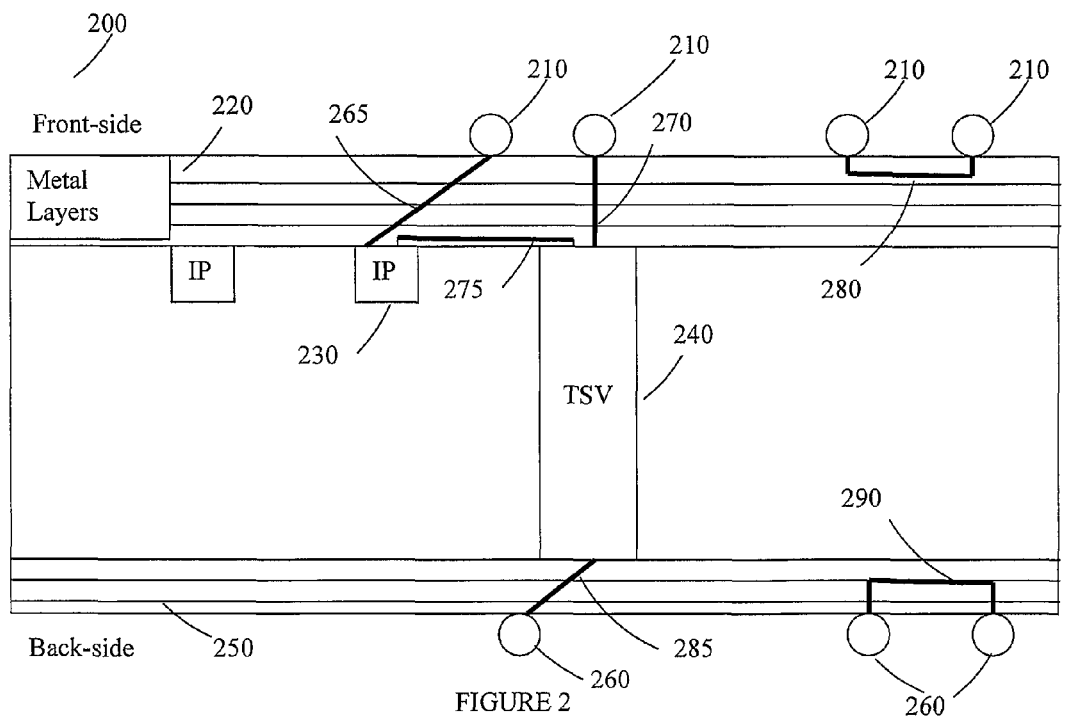
FIG. 2 show a single die that might be used within a 3D IC.

FIG. 2 shows a single die, 200, that might be used within a 3D IC. An active die contains IP components, 230, that are interconnected by metal layers, 220. The side where IP components, 230, and metal layers, 220, are fabricated is called the face or front side. The other die side with back-side metal layers, 250, is the called the back side. TSVs, 240, are manufactured to reach from one die side to the other, in order to make possible connections to other dies. Two overlapped dies in adjacent tiers are connected by their front-side bump pins, 210 and their back-side bump pins, 260.

The method defines physical nets to implement logical connections. The crossing patterns are formed of inter-die (E) and intra-die (A) nets, TSVs and BPs. A convention is used to automatically name these components resulting from the logical net. All their names start with the name of the original logical net, followed by their type: E, A, TSV or BP. Other type specific information follows, such as the die(s) name, the side, and possibly an index.

FIG. 2 shows the possible intra-die nets. Intra-die net names contain: the name of the original net, the physical component type (A), the name of the die and the die-side. Net 265 connects an IP module, 230, to a front-side bump pin, 210. Net 270 connects a front-side bump pin, 210, to a TSV, 240. Net 275 connects an IP module, 230, to a TSV, 240. Net 280 connects two front-side bump pins, 210. Net 285 connects a TSV, 240, to a back-side bump pin, 260. Net 290 connects two back-side bump pins, 260.

Figure 3:
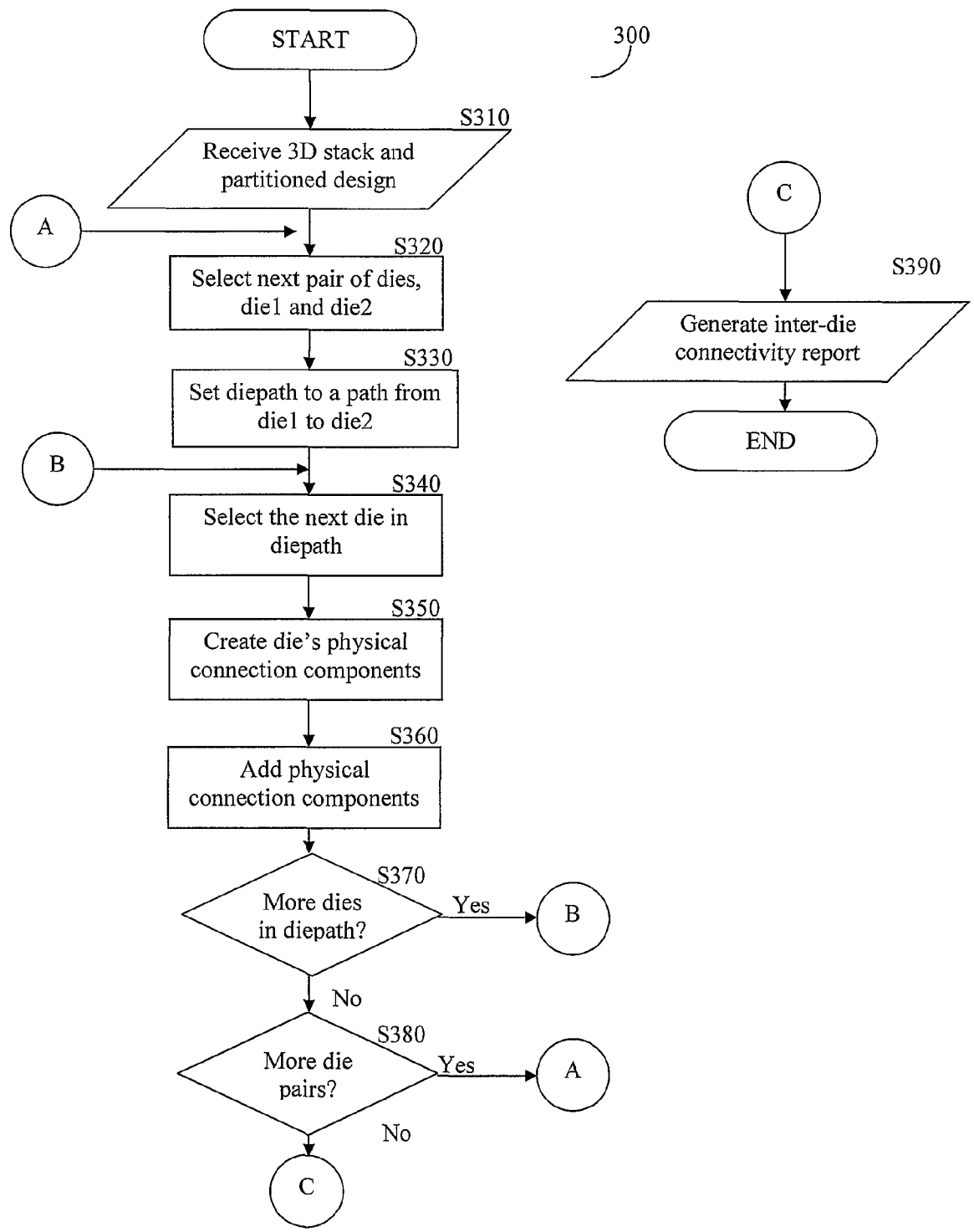
FIG. 3 shows a flowchart for identifying through-silicon-vias (TSVs), bump pins (BPs) and physical net connections.

FIG. 3 is an exemplary and non-limiting flowchart, 300, for identifying TSVs, bump pins and physical net connections. In S310 the method retrieves the partitioned design file and the 3D stack data. The partitioned design file is a pre-floorplan structural design that has been partitioned into multiple dies. The 3D stack data identifies the dies and their physical 3D location and face-up/down orientation within the 3D IC.

In S320 the method selects the next pair of dies to process. Step 320 will select the first die, die1 and second die, die2 on the first iteration. On subsequent iterations it will select other pairs of dies, e.g., the first & third dies, the first & fourth dies, etc.

In S330 the method selects a die-path, a path that connects die1 and die2. In general, several physical paths can be determined between a pair of dies. In one embodiment, similar physical paths are determined for IPs in the same pair of dies. In this embodiment the method processes pairs of dies instead of pairs of IPs. This allows speeding up the translation process, since the method can be executed only once for each pair of dies. The resulting generic path can be then instantiated to create physical paths for all logical nets between the respective pair of dies. To determine the dies to span from source to target die, the 3D stack is represented as a graph, where dies are nodes and connections between dies are edges. Two dies are connected if they are in adjacent tiers and the overlapping area is larger enough to contain connections. The path of dies between any pair of dies is determined using this die graph. In one embodiment, the path is the minimal one in terms of number of visited dies. For example, considering the 3D stack in FIG. 1, to connect an IP1 in die D20 with an IP2 in die D11, the die path is: D20, D10, D00, and D11.

In S340 the method selects the next die in the die path determined by S330. In the above example it will selects D20 on the first iteration and D11 on the last iteration. In S350 the method instantiates all the physical components and nets needed by the selected die. The physical components are the TSV and the BP instantiations on each of the die based on the stack configuration. The method makes use of common paths when processing multiple fan-outs of inter-die connections. For example, if a net from die D20 drives two components in die D11, the method will use one path through dies D20, D10, D00, and D11 and then two intra-die nets within D11.

In S360 the method adds the newly created physical components and nets to the design database. In S370 the method checks if there are more unprocessed dies within the die path. If there are more unprocessed dies it continues at S340 otherwise it continues at S380. In S380 the method checks if there are more unprocessed die pairings. If there are more die pairings it continues at S320 otherwise it continues at S390. In S390 the method generates an inter-die connectivity report. The report lists logical and physical inter-die connections.

As an example of method 300, a logical connection named "y1" between die D20 and die D11 of FIG. 1 generates the physical components and nets below:

y1_A_D20_F (net on face of D20)
y1_BP_D20_F (BP on face of D20)
y1_E_D20_D10 (net inter-die)
y1_BP_D10_B (BP on back of D10)
y1_A_D10_B (net on back of D10)
y1_TSV_D10 (TSV on D10)
y1_A_D10_F (net on face of D10)
y1_BP_D10_F (BP on face of D10)
y1_E_D10_D00 (net inter-die)
y1_BP_D00_F__0 (BP on interposer die)
y1_A_D00_F (net on interposer)
y1_BP_D00_F__1 (BP on interposer die)
y1_E_D00_D11 (net inter-die)
y1_BP_D11_F (BP on face of D11)
y1_A_D11_F (net on face of D11)

Figure 4:
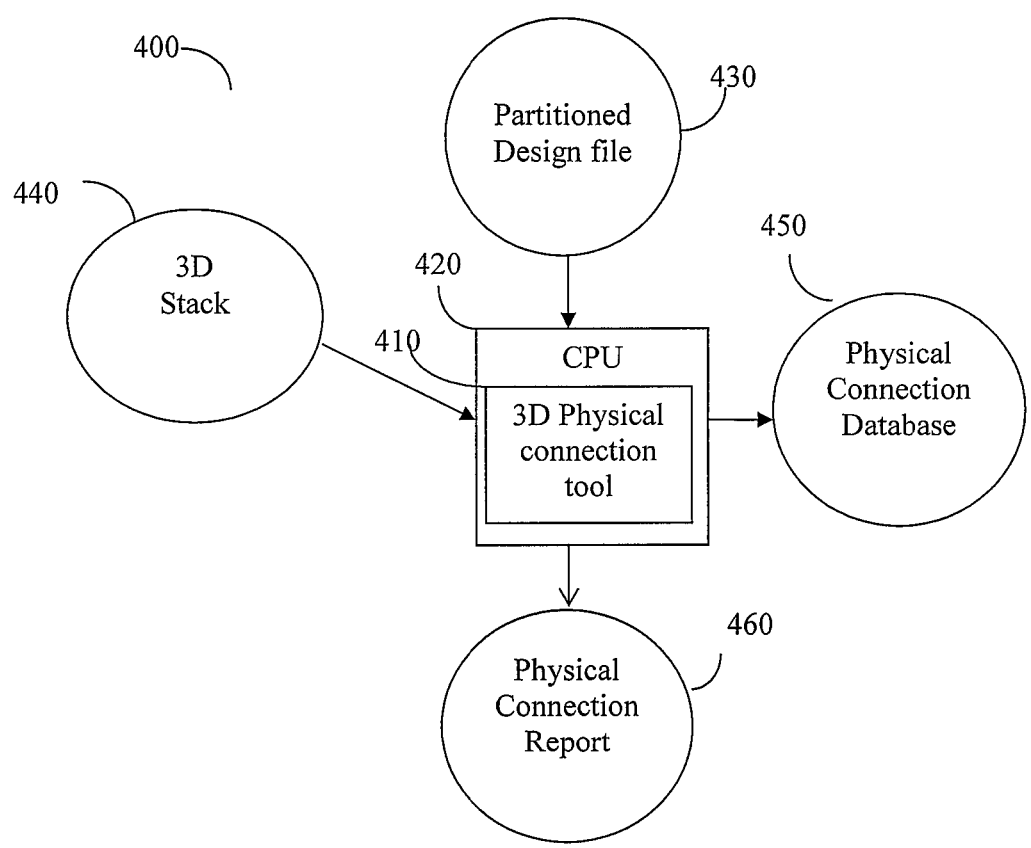
FIG. 4 shows a 3D physical connection tool.

FIG. 4 is an exemplary and non-limited diagram showing a 3D Physical Connection tool (3DPCT) 410. The 3DPCT 410 is part of an electronic design automation (EDA) tool chain. The 3DPCT 410 creates physical connections for a pre-layout, partitioned design, 430, to be implemented as a 3D IC defined by the 3D stack, 440. In one embodiment the 3DPCT 410 runs as an application program on a central processing unit (CPU), 420. The pre-layout, partitioned design, 430, and 3D stack, 440, are stored on a storage device such as a hard disk drive or memory. The 3DPCT 410 creates a physical connection database, 450, and a physical connection report, 460. The physical connection database 450 resides on a storage device and contains the newly creates bump pins, TSVs and nets. The physical connection report 460 resides on a storage device and contains connection information including the number of BPS, TSVs and connections for each die.

The embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

What is claimed is:

1. An electronic design automation method implemented in a computing system for creating a physical connection netlist for a pre-floorplan partitioned design file of a 3D integrated circuit containing stacked tiers of dies, the method comprising receiving, using a computer in the system, a hardware description of a pre-floorplan integrated circuit design, the design having been partitioned so as to assign logic to respective ones of multiple dies, the design further including a 3D stack model defining locations and orientations of the multiple dies within a stack of tiers of such dies, each tier containing one or more dies at a same level in the stack;

selecting and processing, using the computer, in successive iterations different pairs of dies, wherein for each selected pair of dies the processing comprises successive iterations of creating physical connections data for selected die paths connecting the pair of dies, the physical connections data defining through-silicon vias, bump pins and both intra-die and inter-die connecting nets for the selected die paths of the pair of dies; and storing in a memory of the computing system all created physical connections data for all selected die paths for all selected pairs of dies as a netlist for the received design.

2. The method as in claim 1, wherein the 3D stack model is represented as data defining a die graph with dies of the partitioned circuit design as nodes of the graph and connections between dies as edges of the graph.

3. The method as in claim 2, wherein the selecting of die paths to connect pairs of dies uses the die graph of the 3D stack.

4. The method as in claim 1, wherein the selecting of die paths to connect pairs of dies minimizes the number of visited dies.

5. The method as in claim 1, wherein the creating of physical connections data processes any multiple fan-ins and fan-outs of inter-die connections through a common the path.

6. The method as in claim 1, wherein intra-die connecting nets define any one or more of metal layer connections (a) between die circuit modules in the design, (b) between one or more die circuit modules and bump pins on a face of a die, (c) between one or more die circuit modules and through-silicon vias of a die, (d) between two or more bump pins of a die, and (e) between one or more bump pins and through-silicon vias of a die.

7. The method as in claim 1, wherein inter-die connecting nets define any one or more of bump pin connections between overlapping die in adjacent tiers.

8. The method of claim 1, where the physical connections data comprise a label for each connection that provides a name derived from an original net name in the hardware description, component type, die name or inter-die source/destination die names, and a die side.

9. An electronic design automation computing system for creating a physical connection netlist for a pre-floorplan partitioned design file of a 3D integrated circuit containing stacked tiers of dies, the system comprising at least one processing unit and a memory accessible by the processing unit, the memory storing a hardware description of a pre-floorplan integrated circuit, the memory also storing a set of program instructions of a 3D physical connection tool that when executed by the processing unit causes the system to:

select and process in successive iterations different pairs of dies from the stored hardware description of the partitioned circuit design, the design having been partitioned so as to assign logic to respective ones of multiple dies, the design further including a 3D stack model defining locations and orientations of the multiple dies within a stack of tiers of such dies, each tier containing one or more dies at a same level in the stack, wherein for each selected pair of dies the processing comprises successive iterations of creating physical connections data for selected die paths connecting the pair of dies, the physical connections data defining through-silicon vias, bump pins and both intra-die and inter-die connecting nets for the selected die paths of the pair of dies; and store in the memory all created physical connections data for all selected die paths for all selected pairs of dies as a netlist for the received design.

10. The system as in claim 9, wherein the 3D stack model stored in the memory and operated on by the at least one processing unit is represented as data defining a die graph with dies of the partitioned circuit design as nodes of the graph and connections between dies as edges of the graph.

11. The system as in claim 10, wherein the selecting of die paths to connect pairs of dies uses the die graph of the 3D stack.

12. The system as in claim 9, wherein the selecting of die paths to connect pairs of dies minimizes the number of visited dies.

13. The system as in claim 9, wherein the creating of physical connections data processes any multiple fan-ins and fan-outs of inter-die connections through a common die path.

14. The system as in claim 9, wherein intra-die connecting nets define any one or more of metal layer connections (a) between die circuit modules in the design, (b) between one or more die circuit modules and bump pins on a face of a die, (c) between one or more die circuit modules and through-silicon vias of a die, (d) between two or more bump pins of a die, and (e) between one or more bump pins and through-silicon vias of a die.

15. The system as in claim 9, wherein inter-die connecting nets define any one or more of bump pin connections between overlapping die in adjacent tiers.

16. The system as in claim 9, where the created physical connections data stored in the memory comprise a label for each connection that provides a name derived from an original name in the hardware description, component type, die name or inter-die source/destination die names, and a die side.

* * * * *